United States Patent
Veeder

(10) Patent No.: US 8,158,923 B2
(45) Date of Patent: Apr. 17, 2012

(54) TIME-FREQUENCY FUSION DIGITAL PIXEL SENSOR

(75) Inventor: Kenton T. Veeder, Winthrop, MA (US)

(73) Assignee: Raytheon Company, Waltham, MA (US)

( * ) Notice: Subject to any disclaimer, the term of this patent is extended or adjusted under 35 U.S.C. 154(b) by 484 days.

(21) Appl. No.: 12/355,514

(22) Filed: Jan. 16, 2009

(65) Prior Publication Data

US 2010/0181464 A1    Jul. 22, 2010

(51) Int. Cl.
*H01J 40/14*    (2006.01)

(52) U.S. Cl. ............................. 250/214 R; 250/214 DC

(58) Field of Classification Search .............. 250/214 R, 250/214 DC, 208.1; 327/101, 514; 348/572
See application file for complete search history.

(56) References Cited

U.S. PATENT DOCUMENTS

| | | |
|---|---|---|
| 3,022,469 A | 2/1962 | Bahrs et al. |
| 7,683,307 B2 * | 3/2010 | Kawaguchi et al. ....... 250/208.1 |
| 2005/0121617 A1 | 6/2005 | Heismann et al. |

OTHER PUBLICATIONS

PCT Notification of Transmittal of the International Search Report and the Written Opinion of the International Searching Authority, or the Declaration, PCT/US2010/020687, 12 pages, Apr. 7, 2010.
Kleinfelder, et al. "A 10,000 Frames/s CMOS Digital Pixel Sensor" IEEE J. Solid-State Circuits, vol. 36, No. 12, pp. 2049-2059, Dec. 2001.
P. Frohmader, "A Novel MOS Compatible Light Intensity-to-Frequency Converter Suited for Monolithic Integration," IEEE J. Solid-State Circuits, vol. SSC-17, No. 3, pp. 588-591, Jun. 1982.
X. Wang, et al., "A High Dynamic Range CMOS Image Sensor with Inpixel Light-to-Frequency Conversion," IEEE Trans. Electron Devices, vol. 53, No. 12, pp. 2988-2992, Dec. 2006.

* cited by examiner

*Primary Examiner* — Kevin Pyo
(74) *Attorney, Agent, or Firm* — Lando & Anastasi, LLP

(57) ABSTRACT

Light is converted to an electric signal by performing a light-to-frequency conversion of the light received during a first phase of operation. Following the first phase of operation, a light-to-time conversion is performed on light received during a second phase of operation. Following the second phase of operation a digital representation of the light is generated in response to the light-to-frequency conversion and the light-to-time conversion.

15 Claims, 1 Drawing Sheet

TIME-FREQUENCY FUSION DIGITAL PIXEL SENSOR

TECHNICAL FIELD OF THE DISCLOSURE

This disclosure generally relates to image sensors and more particularly to a time-frequency fusion digital pixel sensor.

BACKGROUND OF THE DISCLOSURE

A digital pixel sensor uses in-pixel analog-to-digital conversion to convert an optical image to an electrical signal. Two techniques of performing such a conversion are light-to-frequency conversion and light-to-time conversion. Light-to-frequency conversion operates using a light-controlled oscillator to generate an output waveform, the frequency of which is proportional to the light intensity of the image. Light-to-time conversion uses a single-slope analog-to-digital conversion to generate a digital value that corresponds to the light intensity of the image. Both light-to-frequency conversions and light-to-time conversions have been used in image sensing technologies. However, a variety of benefits and disadvantages are associated with each of these processes. While light-to-frequency conversions have high dynamic ranges and low power consumptions, they exhibit low-light insensitivity. On the other hand, while light-to-time conversions exhibit good low-light sensitivity, they have poor noise floors and high digital power consumption.

SUMMARY OF THE DISCLOSURE

From the foregoing, it may be appreciated by those skilled in the art that a need has arisen for a digital pixel sensor that includes the advantages of light-to-frequency conversion and light-to-time conversion without suffering from the disadvantages. In accordance with embodiments of the disclosure, a time-frequency fusion digital pixel sensor is provided that substantially eliminates or greatly reduces disadvantages and problems associated with conventional digital pixel sensors.

According to one embodiment, light is converted to an electric signal by performing a light-to-frequency conversion of the light received during a first phase of operation. Following the first phase of operation, a light-to-time conversion is performed on light received during a second phase of operation. Following the second phase of operation a digital representation of the light is generated in response to the light-to-frequency conversion and the light-to-time conversion.

According to another embodiment, a digital pixel sensor includes a pixel unit having a detector operable to receive a light signal and determine a voltage associated with the received light signal. A comparator compares the voltage of the light signal to a fixed reference voltage during a first phase of operation. The comparator performs light-to-frequency conversion by generating an output pulse when the voltage of the light signal passes above the fixed reference voltage. During a second phase of operation, the comparator performs light-to-time conversion by comparing the voltage of the light signal to a decreasing reference voltage and generates a final pulse when the reference voltage passes below the voltage of the light signal. A counter is used to count a number of output pulses generated during the first phase where the number of output pulses generated reflects a most significant number of bits of a digital representation of the light signal. The counter is operable to decrease a count value associated with a least significant number of bits of the digital representation of the light signal during the second phase. The counter is operable to stop decreasing the count value in response to the final pulse to establish the least significant number of bits of the digital representation of the light signal.

A potential technical advantage of some embodiments of the invention is the ability to maintain all the benefits associated with a standard light-to-time and light-to-frequency conversion while eliminating their disadvantages. Such benefits include having a high dynamic range, reasonable noise floor, and low digital power consumption as found in light-to-frequency conversion sensors. While maintaining the benefits of the light-to-frequency conversion sensors, a potential advantage of some embodiments of the invention is the elimination of a drawback associated with a light-to-frequency conversion, namely low-light insensitivity, not found in light-to-time conversion. Another potential technical advantage is the ability to increase the responsivity of a pixel without sacrificing its well capacity.

BRIEF DESCRIPTION OF THE DRAWINGS

A more complete understanding of embodiments of the disclosure will be apparent from the detailed description taken in conjunction with the accompanying drawings, wherein like reference numerals represent like parts, in which.

DETAILED DESCRIPTION OF EXAMPLE EMBODIMENTS

Figure 1:
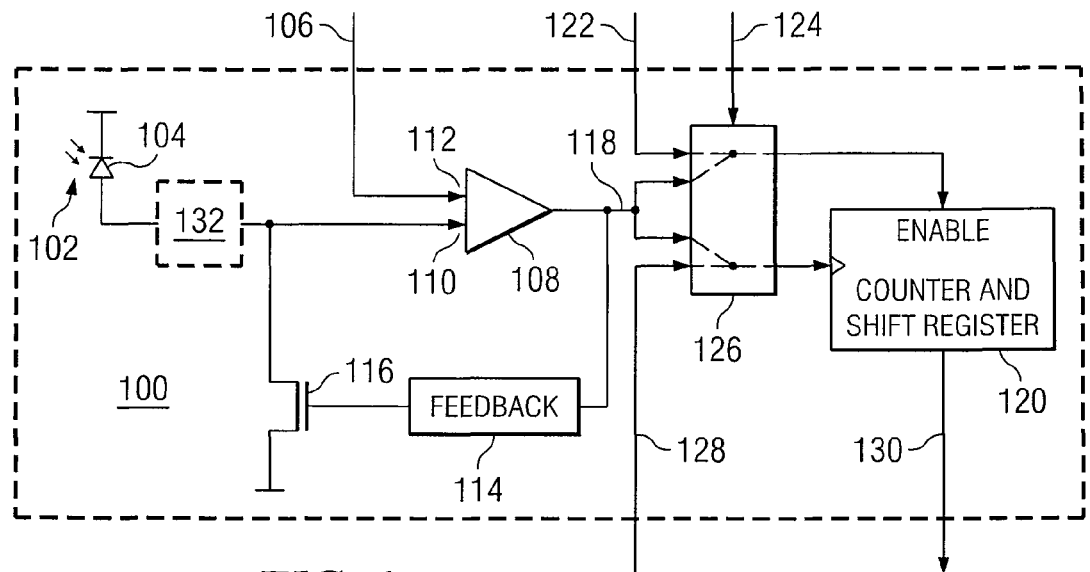
FIG. 1 illustrates an example architecture of a time-frequency fusion pixel sensor.

FIG. 1 illustrates an example architecture for time-frequency fusion digital pixel sensor 100. In sensor 100, a detector 104 absorbs incident light 102 and generates a voltage signal provided to an input 110 of a comparator 108. The voltage signal at input 110 is proportional to an intensity of light 102. During a first phase of the sensor 100 operation, the voltage present at an input 112 of comparator 108 is fixed and comparator 108 generates pulses at an output 118 whenever the voltage at input 110 passes above the voltage at input 112. A feedback loop 114 resets the voltage at input 110 each time a pulse is generated. During the first phase, a most significant bits section of a counter 120 counts the number of pulses generated at output 118. If an amount of light 102 absorbed at detector 104 is relatively intense, the voltage present at input 110 will increase relatively rapidly and pass above the voltage at input 112 relatively often, producing a relatively high frequency of pulses at output 118. Thus, sensor 100 operates like a light-to-frequency converter during the first phase in that the number of pulses generated at output 118 reflects the intensity of light 102. The most significant bits section of counter 120 represents the most significant bits of the digital representation of the intensity of light 102.

During a second phase of sensor 100 operation, the voltage at input 112 of comparator 108 decreases pursuant to a ramp function at the same time as a least significant bits section of counter 120 counts down from a maximum value. When the voltage at input 112 passes below the voltage at input 110, the comparator generates a final pulse at output 118 that stops the count down in the least significant bits section of counter 120. The least significant bits section of counter 120 represents the least significant bits of the digital representation of the intensity of light 102. If the second phase begins shortly after an output pulse 118 is generated during the first phase, the voltage present at input 110 will be relatively low. Thus, a relatively large amount of time will elapse before the voltage at input 112 passes below the voltage at input 110, resulting in a relatively low count in the least significant bits section of counter 120. A relatively low count in the least significant bits section of counter 120 would signify that the digital representation of the intensity of light 102 is not many least significant bits higher than the digital representation calculated during the first phase. Thus, sensor 100 operates like a light-to-time converter during the second phase in that the amount of time elapsed, as reflected in the least significant bits section of the counter, reflects the intensity of light 102.

The detector 104 may be a photodiode or any other device operable to absorb light 102 and reflect the intensity of light 102 absorbed as a proportional rate of increase in the voltage at an input. In sensor 100, detector 104 absorbs light 102 and reflects the intensity of light 102 absorbed as a proportional rate of increase in the voltage at input 110 of comparator 108.

Comparator 108 has inputs 110 and 112 and an output 118. Comparator 108 may be any device operable to compare two voltages and switch its output to indicate which voltage is larger. In sensor 100, when the voltage at input 110 is higher than that at input 112, output 118 is pulsed high. When the voltage at input 110 is lower than that at input 112, output 118 is pulsed low. Comparator 108 supplies its output 118 to counter 120 by way of switches 126.

A global reference and ramp voltage 106 supplies a voltage signal to input 112 of comparator 108. During the first phase of sensor 100 operation, sensor 100 operates similar to a light-to-frequency converter by establishing a fixed voltage for global reference and ramp voltage 106 to be provided input 112. During the second phase of the sensor 100 operation, global reference and ramp voltage 106 is allowed to decrease the amount of voltage supplied at input 112 until the voltage at input 112 passes below the voltage at input 110. The decrease in voltage may be implemented using a self-calibrating adaptive ramp.

A feedback loop 114 and reset switch 116 reset the voltage at input 110 each time output 118 at comparator 108 goes high. Thus, each time the voltage at input 110 passes above the voltage of input 112, the voltage at input 110 is reset. When the voltage at input 112 is constant, the frequency of the output pulses 118 is a reflection of the intensity of light 102. The width of a pulse generated at output 118 is set by the loop delay in the comparator—feedback—reset switch control loop.

Counter 120 operates pursuant to start signal 122 and comprises two sections, a most significant bits section and a least significant bits section. During the first phase, the most significant bits section increases its count each time a pulse is generated at output 118. During the second phase, the most significant bits section stops increasing its count, while the least significant bits section decreases its count from a maximum value. The least significant bits section stops decreasing its count upon the generation of a pulse at output 118 by comparator 108. Counter 120 also comprises a shift register operable to shift out the finished digital output 130 to external electronics. Counter 120 may also include storage of a measured offset to remove fixed-pattern noise.

Phase signal 124 and global reference and ramp voltage 106 are used to transition from the first phase, in which light-to-frequency conversion occurs, to the second phase, in which light-to-time conversion occurs. Phase signal 124 is arranged to effect a phase transition after a set percentage of integration time. In a non-limiting example, the phase transition may be set to occur after 90% of the integration time. Thus, after 90% of the integration time, the new phase signal 124 is transmitted to the pixel 100. At the same time, the global reference and ramp voltage 106 decreases the voltage supplied to input 112.

Phase signal 124 interacts with switches 126 to transition from the first phase to the second phase. Before the transmission of the phase signal, the switches 126 route pulses generated at output 118 to the most significant bits section of the counter 120. After the transmission of the phase signal, the switches 126 route the final pulse generated at output 118, as well as a global clock 128, to the least significant bits section of counter 120.

During the second phase, the least significant bits section counts down from a maximum value using a global clock 128. Following the generation of the final pulse at output 118, the global clock 128 may be used to shift out the finished digital output 130 to external electronics. A potential advantage of some embodiments is the low number of global clock cycles required. Global clock 128 need not be fast as most applications would only require four to six bits of resolution for the least significant bits. As a global clock has $2^N$ clock cycles, where N is the resolution of conversion, only 16 to 64 clock cycles would be required in some embodiments.

A gain structure or direct-injection field-effect transistor 132 may be placed in sensor 100 between detector 104 and input 110 of comparator 108. Gain structure 132 may be used to amplify the signal generated at detector 104 if extremely low input signals were required. A direct-injection field-effect transistor 132 may be used instead to allow the use of constant bias detectors.

Sensor 100 merges a light-to-frequency conversion process with a light-to-time conversion process. Thus, a potential technical advantage of some embodiments of the invention is the ability to maintain all the benefits associated with a standard light-to-frequency conversion while eliminating its drawbacks. Such benefits include having a high dynamic range, reasonable noise floor, and low digital power consumption. While maintaining the benefits of a light-to-frequency conversion, a potential advantage of some embodiments of the invention is the elimination of the low-light insensitivity associated with a light-to-frequency conversion as a light-to-time conversion process may be used to calculate the least significant bits portion of the digital representation of the intensity of light 102.

Another potential advantage of some embodiments of the invention is the ability to increase the responsivity of a pixel without sacrificing its well capacity. Well capacity, rather than being defined by the integration capacitance, may be defined by the number of bits in the counter. Doubling a pixel's well capacity would require the addition of one bit in the most significant bits section of counter 120. Thus, if the area of the photodiode is doubled to increase the responsivity of the pixel, well capacity may not decrease if an extra bit is added to the counter.

Another potential advantage of some embodiments of the invention is a reduced noise level. During the first phase of sensor 100 operation, the noise level will be compressed by the square root of the number of output pulses, similar to as in a light-to-frequency conversion sensor. During the second phase of sensor 100 operation, the noise level will be relatively low since the second phase may be performed on a residue of the data stored on the most significant bits section of counter 120.

Figure 2:
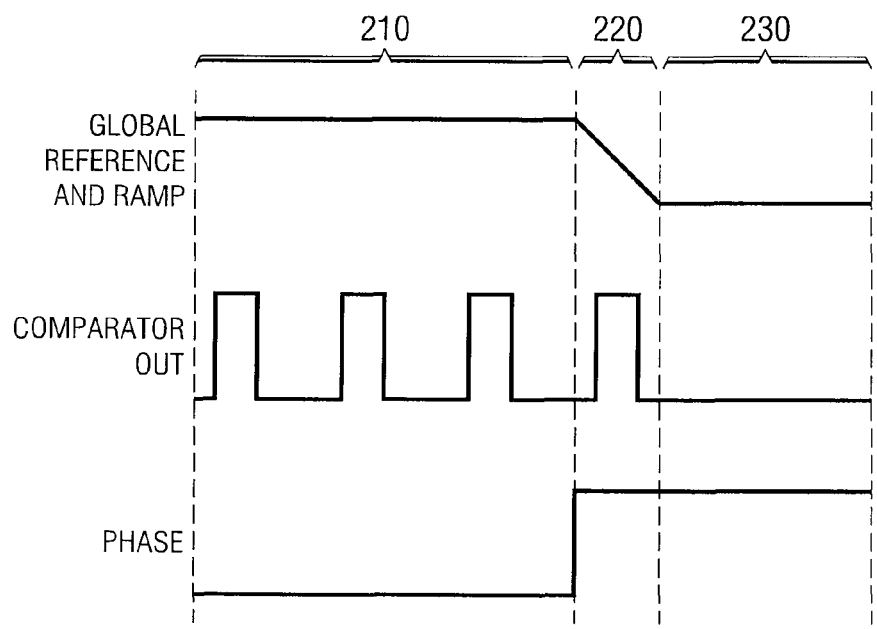
FIG. 2 illustrates a timing diagram for the time-frequency fusion pixel sensor.

FIG. 2 illustrates a timing diagram for the time-frequency fusion digital pixel sensor 100. During time period 210, phase signal 124 is low and global reference and ramp voltage 106 supplies a fixed voltage to input 112 of comparator 108 for light-to-frequency conversion. As detector 104 absorbs light 102, the voltage at input 110 of comparator 108 passes above the fixed voltage at input 112. Each time the voltage at input 110 passes above the voltage at input 112, a pulse is provided at output 118. Feedback loop 114 resets the voltage at input 110 to establish a pulse width for the pulse at output 118. Thus, the operation of sensor 100 generates a stepped-waveform representing pulses generated at output 118 of comparator 108 as the voltage at input 110 repeatedly passes above the voltage at input 112. During time period 210, when the phase signal 124 is low, each pulse generated at output 118 is routed to the most significant bits section of counter 120.

During time period 220, phase signal 124 switches to a high level and the voltage supplied by global reference and ramp voltage 106 decreases linearly for light-to-time conversion. As the voltage provided by global reference and ramp voltage 106 decreases, comparator 108 generates a final pulse at output 118 when the voltage at input 112 passes below the voltage at input 110. When the phase signal is high, the global clock 128 is routed to counter 120 to decrease the count of the least significant bits section. When the final pulse at output 118 is generated, it is routed to the least significant bits section of counter 120, stopping its decrease in count. During time period 230, the phase signal 124 remains high to allow the global clock 128 to shift out the finished digital output 130 to external electronics.

Although the present disclosure and its advantages have been described in detail, it should be understood that various changes, substitutions, and alterations can be made therein without departing from the spirit and scope of the disclosure as defined by the appended claims.

What is claimed is:

1. A method for converting light to an electric signal comprising:
    performing a light-to-frequency conversion of the light received during a first phase;
    performing a light-to-time conversion of the light received during a second phase, wherein the second phase follows the first phase; and
    generating a digital representation of the light in response to the light-to-frequency conversion and the light-to-time conversion;
    wherein the first phase comprises:
        receiving a light signal;
        determining a voltage associated with the received light signal;
        comparing the voltage of the light signal to a reference voltage; and
        generating an output pulse when the voltage of the light signal passes above the reference voltage.

2. The method of claim 1, wherein the reference voltage is set to a fixed voltage level.

3. The method of claim 1, further comprising:
    resetting the voltage associated with the light signal in response to the output pulse to establish a pulse width for the output pulse.

4. The method of claim 1, further comprising:
    counting a number of output pulses generated, the number of output pulses generated reflecting the most significant bits of the digital representation of the light signal.

5. A method for converting light to an electric signal, comprising:
    performing a light-to-frequency conversion of the light received during a first phase; and
    performing a light-to-time conversion of the light received during a second phase, wherein the second phase follows the first phase; and
    generating a digital representation of the light in response to the light-to-frequency conversion and the light-to-time conversion,
    wherein the second phase comprises:
        receiving a light signal;
        determining a voltage associated with the received light signal;
        decreasing a reference voltage;
        comparing the voltage of the light signal to the reference voltage; and
        generating a final pulse when the reference voltage passes below the voltage of the light signal.

6. The method of claim 5, further comprising:
    decrementing a counter from a maximum count value until the final pulse is generated.

7. The method of claim 6, wherein a value of the counter when the final pulse is generated reflects the least significant bits of the digital representation of the light level.

8. A method for converting light to an electric signal, comprising:
    performing a light-to-frequency conversion of the light received during a first phase; and
    performing a light-to-time conversion of the light received during a second phase, wherein the second phase follows the first phase;
    generating a digital representation of the light in response to the light-to-frequency conversion and the light-to-time conversion;
    receiving a light signal;
    determining a voltage associated with the received light signal;
    comparing the voltage of the light signal to a reference voltage during the first phase;
    generating an output pulse when the voltage of the light signal passes above the reference voltage during the first phase;
    resetting the voltage associated with the light signal in response to the output pulse to establish a pulse width for the output pulse during the first phase;
    counting a number of output pulses generated, the number of output pulses generated reflecting the most significant bits of the digital representation of the light signal during the first phase;
    decreasing the reference voltage during the second phase;
    comparing the voltage of the light signal to the reference voltage during the second phase;
    generating a final pulse when the reference voltage passes below the voltage of the light signal during the second phase;
    decrementing a counter from a maximum count value until the final pulse is generated during the second phase, wherein a value of the counter when the final pulse is generated reflects the least significant bits of the digital representation of the light level;
    outputting the most significant bits and the least significant bits in a digital representation of the light signal.

9. A digital pixel sensor, comprising:
    a pixel unit operable to perform a light-to-frequency conversion during a first phase of operation and a light-to-time conversion during a second phase of operation, wherein the second phase follows the first phase,
    wherein the pixel unit comprises:
        a detector operable to receive a light signal, the detector operable to determine a voltage associated with the received light signal;
        a comparator operable to compare the voltage of the light signal to a fixed reference voltage during the first phase, the comparator operable to perform light-to-frequency conversion by generating an output pulse when the voltage of the light signal passes above the fixed reference voltage, the comparator operable to compare the voltage of the light signal to a decreasing reference voltage during the second phase, the comparator operable to perform light-to-time conversion by generating a final pulse when the reference voltage passes below the voltage of the light signal.

10. The digital pixel sensor of claim 9, wherein the pixel unit includes a feedback loop operable to reset the voltage at the first input of the comparator after each output pulse is generated.

11. The digital pixel sensor of claim 10, wherein a pulse width of the output pulse is established by a time delay of the feedback loop.

12. The digital pixel sensor of claim 9, wherein the pixel unit includes a counter operable to count a number of output pulses generated during the first phase, the number of output pulses generated reflecting a most significant number of bits of a digital representation of the light signal.

13. The digital pixel sensor of claim 12, wherein the counter is operable to decrease a count value associated with a least significant number of bits of the digital representation of the light signal during the second phase.

14. The digital pixel sensor of claim 13, wherein the comparator is operable to stop decreasing the count value in response to the final pulse to establish the least significant number of bits of the digital representation of the light signal.

15. The digital pixel sensor of claim 14, wherein the counter is operable to output the most significant number of bits and the least significant number of bits of the digital representation of the light signal in response to the final pulse.

* * * * *